(12) United States Patent
Freeman

(10) Patent No.: US 6,252,917 B1
(45) Date of Patent: Jun. 26, 2001

(54) STATISTICALLY MULTIPLEXED TURBO CODE DECODER

(75) Inventor: Benedict Russell Freeman, Cambridge (GB)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/118,203

(22) Filed: Jul. 17, 1998

(51) Int. Cl.[7] ................................................. H03D 1/00
(52) U.S. Cl. ........................ 375/340; 375/346; 714/759
(58) Field of Search ................................. 375/340, 346, 375/341, 348, 262; 370/312, 347, 321, 431, 432, 442, 473, 510, 351, 360, 329, 336, 337; 455/464; 714/759, 776

(56) References Cited

U.S. PATENT DOCUMENTS

| | | | |
|---|---|---|---|
| 5,646,982 | * | 7/1997 | Hogan et al. ............................ 379/89 |
| 6,069,886 | * | 5/2000 | Ayerst et al. ........................ 370/336 |
| 6,134,589 | * | 10/2000 | Hultgren ............................... 709/227 |

\* cited by examiner

Primary Examiner—Chi Pham
Assistant Examiner—Emmanuel Bayard
(74) Attorney, Agent, or Firm—Lee, Mann, Smith, McWilliams, Sweeney & Ohlson

(57) ABSTRACT

A decode apparatus for decoding a plurality of encoded messages received over a noisy transmission link, eg., a satellite link or a radio telecoms link comprises a demodulator for demodulating analogue signals to produce a digitized bit stream; an analyzer comprising a received signal strength indicator; a carrier to noise ratio measurement means; a look up table for reading data describing an optimized number of decode iterations; an array of turbo code decoders, each having an associated local storage buffer; and a scheduler means for scheduling demodulated message packets to each of the plurality of decoder processors, depending upon an estimated optimum number of decode operations required for each message packet. Allocation of the message packets to the plurality of decode processors is made such as to optimize overall utilization of the decode processors. The number of decode processors required for a system is estimated from a statistical analysis of the noise and optimum number of decode iterations required to decode an incoming time division multiplex bit stream having time division messages which differ in noise ratio, and hence require different processing powers for decoding, between successive time division multiplex messages.

12 Claims, 8 Drawing Sheets

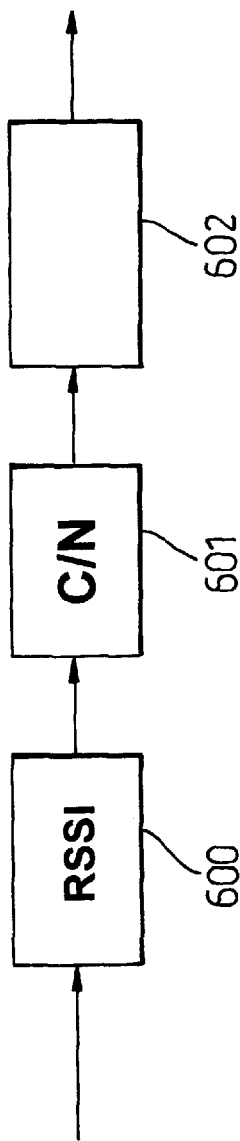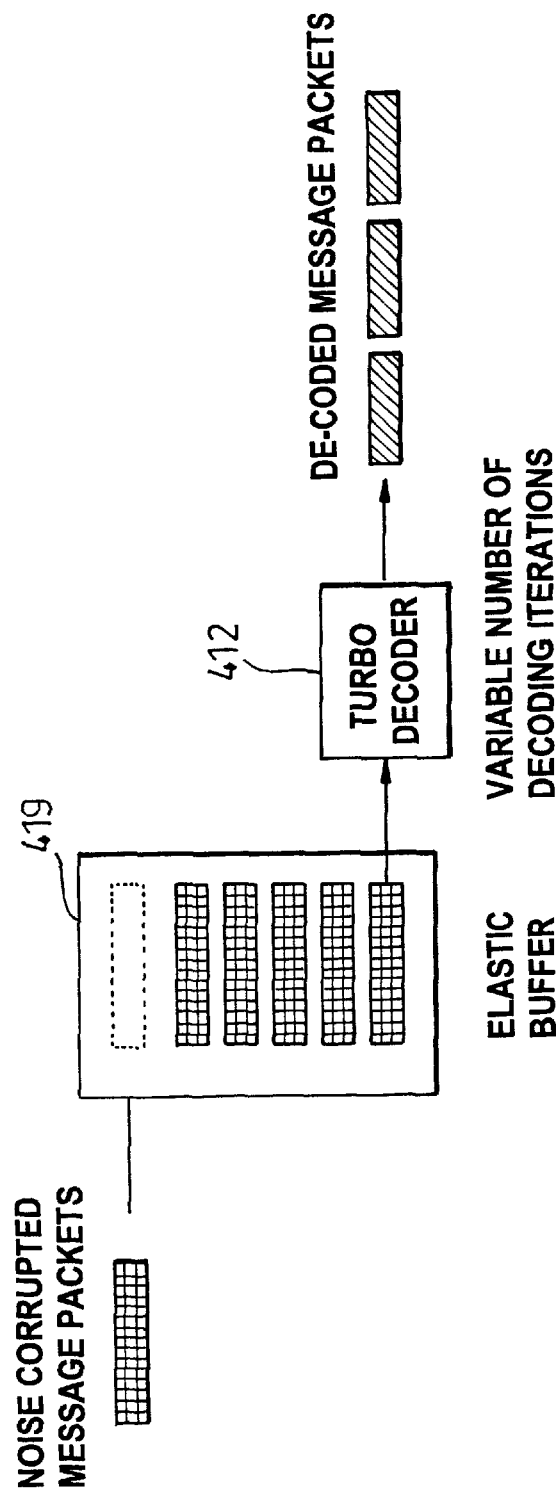
Fig. 6
Fig. 7

STATISTICALLY MULTIPLEXED TURBO CODE DECODER

FIELD OF THE INVENTION

The present invention relates to decoding of received signals and particularly, although not exclusively to decoding of signals received over a satellite link, or a terrestrial microwave link.

BACKGROUND OF THE INVENTION

In microwave communications links, for example between a satellite and one or a plurality of earth stations, or between a radio base station of a terrestrial wireless communications system, transmitted signals become corrupted by noise due to a variety of factors, for example background noise, noise introduced through transmitter and receiver components, noise introduced through atmospheric transmission conditions, and interference introduced from other transmitters operating interfering carrier frequencies. In each case, for overlapping, but slightly different reasons, there is an advantage in being able to deal with a signal having as low a carrier to interference ratio, or as low a signal to noise ratio as possible. Toleration of a lower C/I or SNR ratio enables, use of lower power transmitter and receiver equipment, thereby in a satellite system, reducing the weight of equipment which needs to be launched, and reducing the power supply requirements of the equipment. In the case of terrestrial wireless systems, tolerating a lower carrier to interference ratio and signal to noise ratio enables mobile handsets having lower power transmitter apparatus, thereby reducing the size and power requirements of the handset, and possibly increasing the capacity of the overall terrestrial wireless system.

In order to recover transmitted signals which are received with a relatively low level of carrier to interference ratio and/or signal to noise ratio, it is known, prior to transmitting the signals to encode the signals with redundant bits of information according to known encoding algorithms. On receipt of the coded signals, known decoders are able to reconstruct parts of a signal which have been irretrievably corrupted due to noise or interference, and reconstruct the original signal from the redundant information contained in the coding. Such systems are known as forward error correction coded systems. Although the forward error correction codes add redundant bits to a signal to be transmitted, and effectively decrease the bandwidth available for data transmission, benefits are achieved in being able to decode signals which would otherwise be unable to be decoded, and improving the range, power consumption, and weight of transmitter and receiver equipment which can be used. The coding overhead of transmitting extra coding bits using forward error correction systems enable improvements in the effective bit error rate (BER) of a transmission link. In particular for satellite systems, the bit error rate of a satellite link is a limiting factor in performance of a satellite, since it has a direct impact on the power requirements of the launched transmitter/receiver equipment, and hence on the is cost of communications equipment. In the case of mobile wireless systems, the bit error rate of a link has a direct impact on the size and power requirements of the handsets which can be used.

A known forward error correction system comprises a convolutional coder and a Viterbi decoder, as is well known in the art, such as are available from Qualcom Incorporated. More recently, there have emerged in the prior art, a set of concatenated recursive codes known as "turbo codes", which may be used for the same purpose as Viterbi forward error correction codes, i.e. improving the bit error rate of transmission links, but which have improved performance compared with Viterbi coded systems. Turbo codes offer an approximate 3 dB improvement over Viterbi codes, which has the practical implication of allowing an approximate halving of transmitter power for a transmission link having a same bit error rate, as compared with a Viterbi coded link. Parallel concatenated systematic recursive codes (otherwise called "turbo codes") are described in "Near Shannon Limit Error-Correcting and Decoding: Turbo Codes (1)" by C Berrou, proceedings ICC May 1993. However, a problem with turbo code decoders compared with prior art forward error correction decoders is that turbo code decoders require increased data processing power. Typically, a known turbo code requires ten times as much processing power as a known Viterbi forward error correction decoder. Processing powers of the order of Giga instructions per second may be required. Digital signal processing apparatus having an ability to handle these volumes of instructions may comprise commercially available digital signal processing chip sets, or alternatively custom made decoder chip sets. Thus, the use of turbo codes instead of Viterbi codes, whilst potentially improving the transmitter/receiver equipment with respect to required transmission power and size of equipment, incurs the penalty of requiring around ten times as much signal processing power as Viterbi decoders. In the case of satellite systems, in addition to the increased cost of the extra signal processing power, the increased power consumption requirement is of concern. In the case of terrestrial wireless base stations, which operate in a cost competitive market, there is the disadvantage of the increased cost of the extra DSP chip sets required for providing the required signal processing power.

SUMMARY OF THE INVENTION

One object of the present invention is to obtain the advantages of turbo code decoders applied to a receiver equipment, for example a satellite equipment or a base station of a terrestrial wireless system, whilst minimizing the power supply requirement and additional cost incurred by the provision of increased digital signal processing power.

Another object of the invention is to optimize the use of signal processing power applied for decoding of turbo code encoded signals, by taking advantage of a statistical analysis of corruption of signals received from a plurality of transmitters.

A further object of the present invention is to reduce an overall required processing power for decoding a plurality of turbo encoded receive signals from a plurality of channels, each channel characterized by having its own corresponding respective signal to noise ratio and/or carrier to interference ratio, by optimizing the use of signal processing capabilities.

According to one aspect of the present invention there is provided a decode apparatus for decoding a plurality of encoded messages each having an associated corruption level, said decoding means comprising:

analyzer means for determining a level of corruption of each said message and generating data describing a signal processing requirement for decoding each said message;

at least one decoder for decoding said encoded messages; and scheduler means for assigning said messages to individual ones of said at least one decoder depending on said signal processing requirement data generated by said analyzer means.

Preferably, said analyzer means comprises:

means for determining a carrier to noise ratio metric of a said message;

means for assigning a number of turbo code decoding iterations to said message.

Preferably said means for determining a number of turbo code iterations comprises a data storage means containing data describing carrier to noise ratio and number of decoding iterations and a relationship between said carrier to noise ratio and said number of iterations.

In the best mode presented, each said decode processor sends signals to said scheduler concerning a status of said decoder. A said status signal may comprise data describing a current number of iterations performed on a specified message packet, or may comprise data describing a convergence rate of bit error rate of a said message.

Preferably, the apparatus further comprises a plurality of buffers, for storing said messages at said decoders, wherein said scheduler sends said message packets to selected individual ones of said buffers for storage prior to decoding.

According to a second aspect of the present invention, there is provided a method of decoding a plurality of encoded message packets, each said message packet having an associated corruption level, said method comprising the steps of:

determining a metric describing said corruption level of each said message packet;

determining according to said metric, a number of decode iterations required for decoding each said message packet; and allocating a signal processing resource for decoding said message packets, depending on said number of required decode operations for each said packet.

Preferably said step of determining a required number of decode iterations comprises:

storing data describing a plurality of levels of corruption of a plurality of message packets;

storing data describing a plurality of numbers of decode iterations required to achieve a predetermined bit error rate, wherein said data describing a number of iterations are stored in a manner which corresponds with individual ones of said corruption levels in a predetermined manner.

Said data describing a plurality of levels of corruption and data describing a predetermined number of decode iterations may be stored in a look up table.

Said step of allocating a digital signal processing resource may comprise selecting a digital signal processor having a lowest buffer occupancy.

Said step of allocating a digital signal processing resource may comprise selecting a digital signal processor means, having a predicted earliest finish time.

Specific embodiments and methods according to the present invention provide an array of turbo decoders having a combined signal processing power in terms of instructions per second sufficient to satisfy an average signal processing requirement for decoding, by means of turbo decoding algorithms, a continuous stream of data packets and messages having different levels of corruption and carrier to interference ratio between different packets. The total data processing power provided by the decoders may be optimized to satisfy the average data processing requirement of the incoming data signals for decoding those data signals for achieving a predetermined bit error rate. System designers may estimate the required total data signal processing power by performing a historical statistical analysis of incoming signals over a period of time and calculating the average number of instructions required over a large number of received signals to achieve on average the required bit error rate.

Specific embodiments and methods of the present invention aim to utilize the available signal processing power to satisfy decoding of incoming message packets having a high signal processing requirement to achieve the predetermined bit error rate, by redirecting signal processing power from signals having a low signal processing requirement towards signals having a higher signal processing requirement. In the specific embodiments and methods herein, an array of decoders may be operated continuously for as high a proportion of time as possible, whilst reducing periods when the decoders are idle, thereby utilizing the available signal processing resources in an optimized manner.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which:

FIG. 6 illustrates schematically a signal analyzer for analyzing a level of corruption of an incoming message signal according to specific embodiment of the present invention;

FIG. 7 illustrates schematically a turbo code decoder means having an associated decode buffer, the decode means operating a variable and programmable number of decode operations on a series of message signals;

DETAILED DESCRIPTION OF THE BEST MODE FOR CARRYING OUT THE INVENTION

There will now be described by way of example the best mode contemplated by the inventors for carrying out the invention. In the following description numerous specific details are set forth in order to provide a thorough understanding of the present invention. It will be apparent however, to one skilled in the art, that the present invention may be practiced without limitation to these specific details. In other instances, well known methods and structures have not been described in detail so as not to unnecessarily obscure the present invention.

Figure 1:
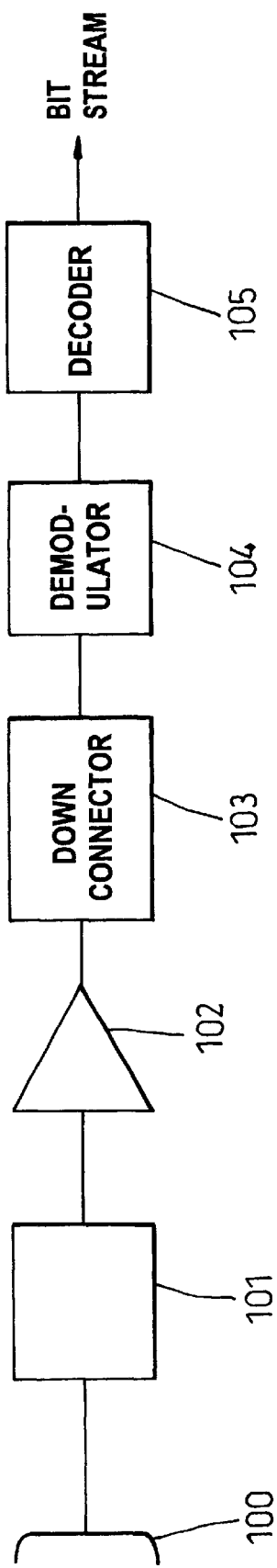
FIG. 1 illustrates schematically a prior art received channel including a conventional know forward error correction code decoder or a conventional known turbo code decoder.

Referring to FIG. 1 herein, there is illustrated schematically a prior art receive channel apparatus for receiving and decoding signals received over a transmission link. The receive channel apparatus of FIG. 1 is described generically for a satellite system or a terrestrial wireless system, however it will be appreciated by those skilled in the art that the frequency of operation and optimization of components in the channel will differ according to known engineering techniques in each respective art. Typically, the RF components of the receive channel apparatus may operate at a frequency in the range 900–1800 MHz for a terrestrial wireless system, or at a frequency of around 40 GHz for a satellite system. The receive channel apparatus comprises an antenna 100, for example a satellite dish antenna, or a microwave base station antenna; a low noise filter 101 outputting a signal to a low noise amplifier 102; a down convertor for down converting an RF signal received from the low noise amplifier to a base band signal typically in the range DC to 10 MHz, the down converted signal being input into a demodulator 104 for demodulation of the signal into a digital bitstream, the digital bitstream being input into a decoder 105 for decoding the coded bitstream into a bitstream of data signals.

Figure 2:
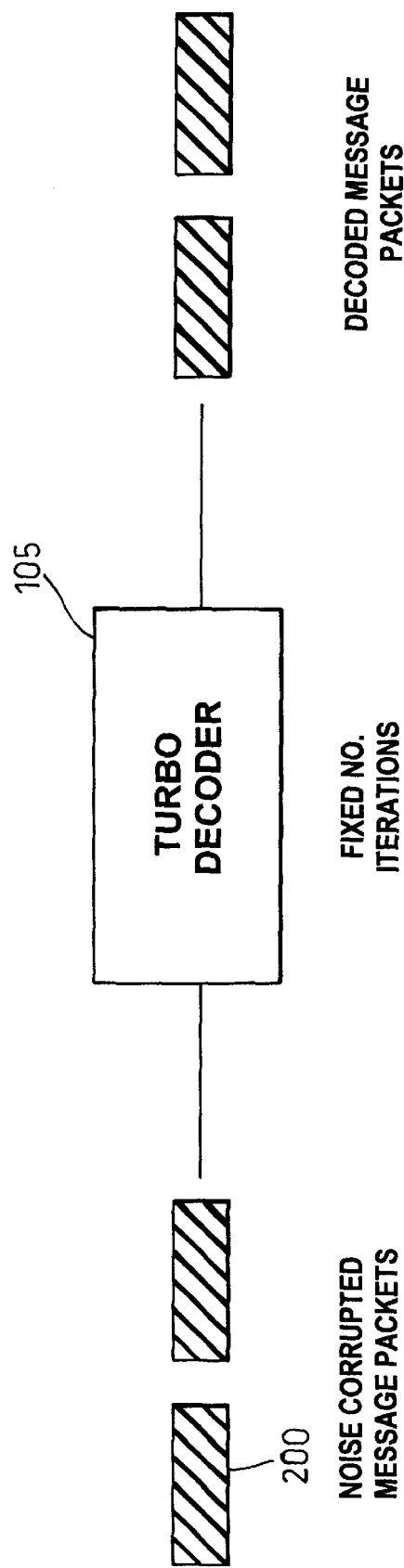
FIG. 2 herein illustrates schematically input of a series of noise corrupted message packets in to a prior art turbo code decoder operating a fixed number of decode iterations, and outputting a plurality of interference reduced decoded message packets.

Referring to FIG. 2 herein, there is illustrated schematically input and output digital signals to de-coder 105 of the prior art receive channel of FIG. 1. In the prior art system of FIG. 1, decoder 105 may operate a conventional forward error correction code (Viterbi code) or may operate a conventional turbo code. In the case of a conventional turbo code decoder 105, the turbo codes operate by iteratively coding an input of a series of noise and/or interference corrupted data packets 200 using a fixed number of decode iterations. An optimum number of iterations may be determined from a knowledge of the corruption of the signal built up over a period of time, and by applying different numbers of iterations on a trial and error basis. If too high a value of iterations is selected, then the usage of the data processing power of the decoder in terms of number of instructions used to achieve a required bit error rate may be higher than optimum. If too low a number of iterations is selected, then a pre-required bit error rate will not be achieved, and the bit error rate of the transmission link will be too high. An optimum number of iterations provides an optimum trade off between achieving a required bit error rate, and achieving an optimally low number of instructions for decoding the bit stream. By optimizing to a lowest required number of iterations of turbo code, the options of using a lower specification, less costly DSP chip and using a lower power consumption DSP chip may become available to a system designer.

The digital bitstream output from demodulator 104 may have signals which vary in corruption over time. For example where packets of data in the bitstream are received from a single source, the transmission characteristics of the link may vary over time due to atmospheric conditions over a period of hours or days. Where the receive apparatus receives a series of signals across a fixed transmission link from a single source, finding an optimum number of iterations to apply to achieve a required bit error rate (BER) is straight forward, since the effect of the transmission link on messages sent can be characterized by collecting historical data concerning the noise corruption of the received messages.

However, where a receive channel receives a plurality of packet signals from a plurality of different sources, for example in a satellite installation receiving multiple user frequency or time division multiple access uplinks, the corruption of successive data packets which have been transmitted over different transmission links from different geographically separated transmitters may vary significantly. Thus, the number of iterations required to optimally decode a first packet will be different from an optimum number of decode iterations required to decode a second, next packet.

Application of a fixed number of decode iterations for decoding a series of messages received from different transmitters and over different paths is inefficient, since to achieve a required bit error rate, using a fixed number of decode iterations, the number of iterations must be set to be high enough to ensure that the worst corrupted received message signals have sufficient processing power applied to achieve the required bit error rate. Received messages having lower levels of corruption still undergo the same number of decode iterations, which is an inefficient use of signal processing power.

There will now be described specific embodiments and methods according to the present invention which aim to provide improved decoding using a statistically multiplexed turbo code decoder operating a variable number of decode iterations depending upon a level of corruption of an incoming signal. In the following description the specific embodiments and methods of the best mode are described in relation to an application of a satellite payload decoder for multiple user F-TDMA uplink systems. It will be appreciated by those skilled in the art that the general principles and concepts laid out herein are of general applicability to communications systems, including but not limited to satellite systems and wireless systems.

Figure 3:
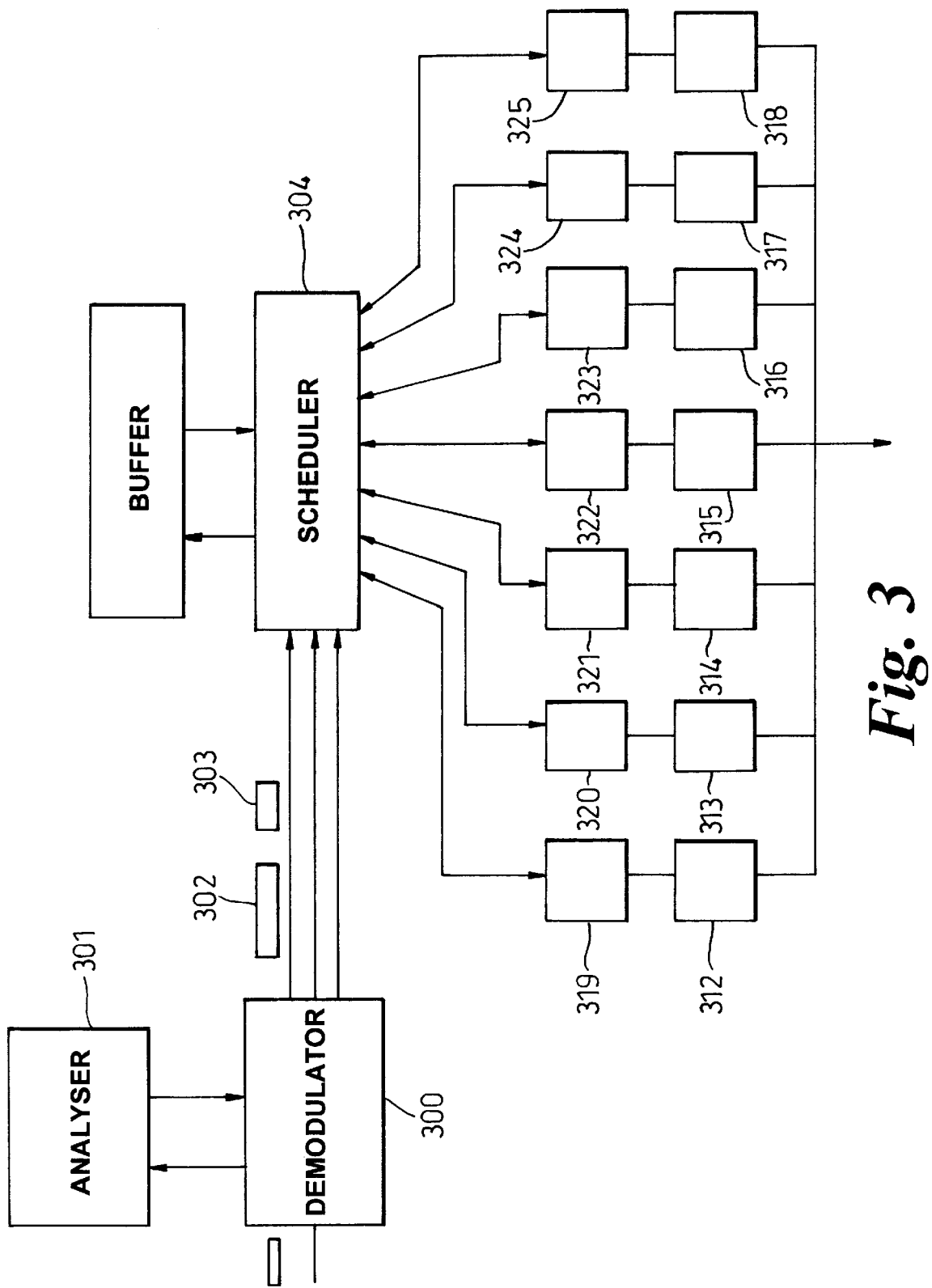
FIG. 3 illustrates schematically a demodulation and decode means according a first specific embodiment of the present invention for demodulating and decoding an input of a plurality of noise corrupted messages received over a transmission link.

Referring to FIG. 3 herein, there is illustrated a demodulation and decode means comprising part of a receive channel according to a specific embodiment of the present invention. Front end portions of the receive channel comprise an antenna, a low noise filter, and an RF down convertor as is known in the prior art. The demodulation and decode means comprises a demodulator 300; an analyzer 301 for analyzing an input analogue signal demodulator 300; a scheduler 404, the scheduler feeding an array of a plurality of turbo decoders 312–318, each turbo decoder having a corresponding respective input buffer 319–325. Optionally, there is provided a buffer 326 at the scheduler for storing message data pending sending the message data to decoders 312–318. The plurality of turbo-decoders 312–318 may comprise conventional digital signal processing chips each operating independently of each other, and in parallel to decode a plurality of data packets routed to the turbo decoders by scheduler 304. The RF down converter outputs a down-converted analog signal which is input into demodulator 300. Demodulator 300 demodulates the received analogue signal and produces a digitized turbo code encoded bitstream.

Figure 4:
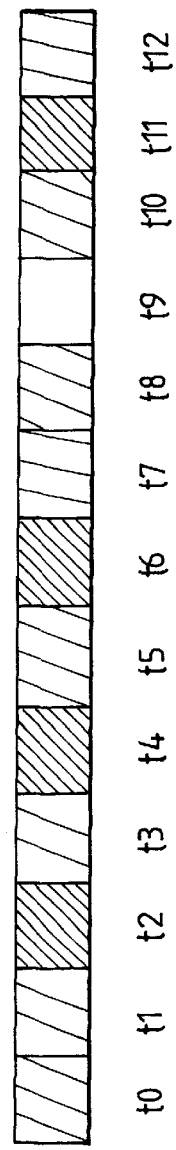
FIG. 4 illustrates schematically a series of message signals received over a plurality of transmission links, the received messages, in general each having a different associated noise and corruption level.

Referring to FIG. 4 herein, there is illustrated schematically a stream of TDMA bearer signals T0–T12 input to demodulator 300, prior to input to the plurality of decoders. The bitstream comprises analogue signals having an associated level of corruption, in the form of noise and/or interference. In a time division multiple access system, the receive channel receives data over a plurality of paths from a plurality of different transmitters. For example, on a satellite uplink, a plurality of earth stations may transmit in time division multiplexed manner, or in a terrestrial wireless system, a plurality of mobile or fixed subscriber apparatus may transmit over a plurality of time division or code division multiple access channels. Because of the variation of transmission characteristics of each of the plurality of links between the receive apparatus and the subscriber apparatus, data message packets or cells received from different transmit apparatus have different levels of associated noise and interference. Data received on some links is heavily corrupted, whilst data received on other links from other transmitter apparatus may be less corrupted. Hereinafter, the terms message, packet and cell will be used interchangeably to mean a time division multiplexed quantity of data received over a same transmission link in a same time division.

Analyzer means 301 analyzes the input signal received from the down-convertor and produces digital data describing various metrics of the received message signals. Digital bitstream output of demodulator 300 comprises a plurality of digital messages to each of which is pre-pended metrics data generated by analyzer 301, the metrics data describing a level of corruption of the message, e.g. signal to noise ratio, or carrier to interference ratio, or other like metric, applying to the particular data message to which it is pre-pended. Messages 302 together with pre-pended metrics data 303 are input into scheduler means 304 which selects one of the plurality of turbo decoders 312–318 to decode that particular message data. The specific turbo decoder to which each message is sent is determined by the scheduler in accordance with the metrics data pre-pended to the message.

Figure 5:
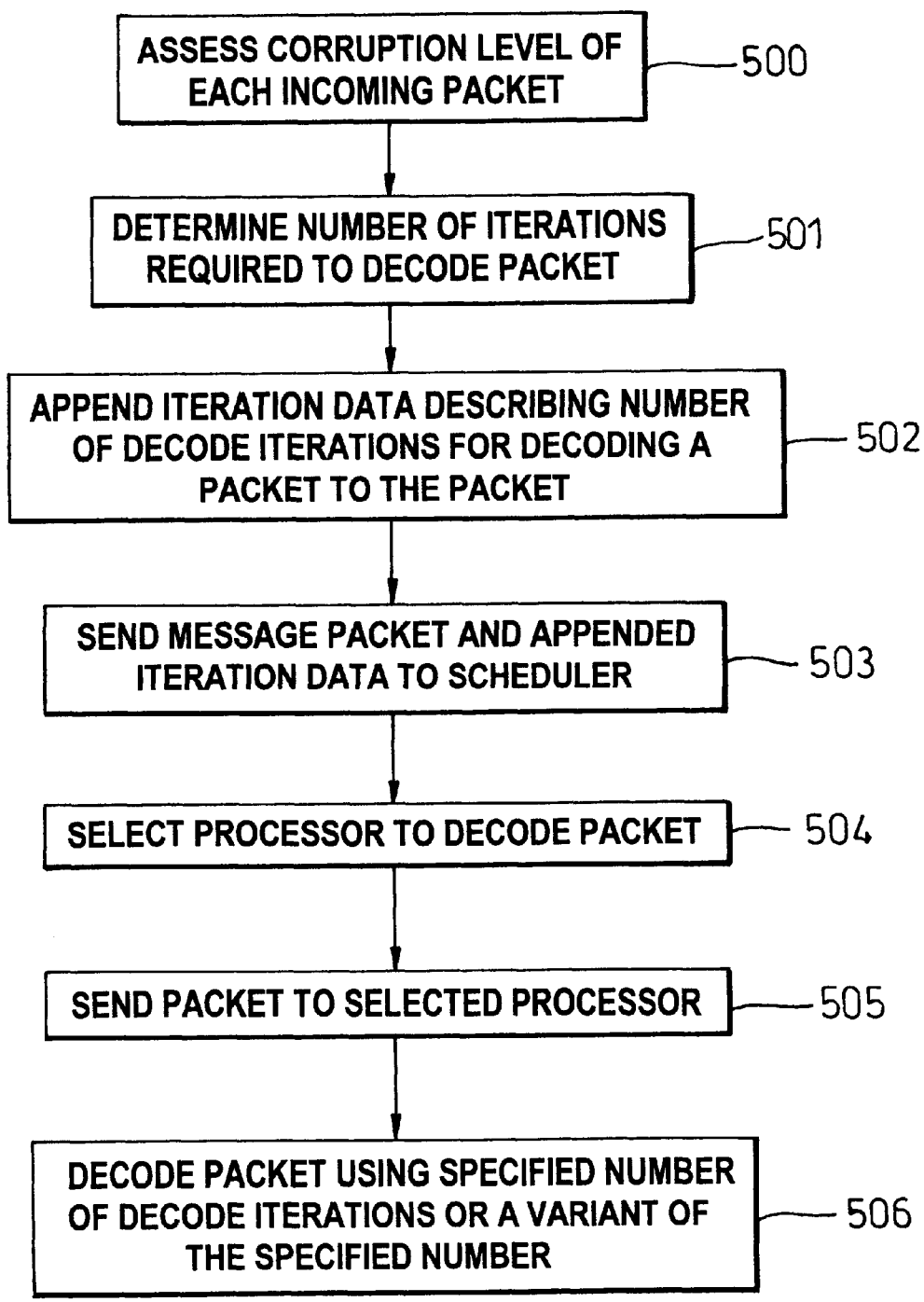
FIG. 5 illustrates schematically general process steps operated by the demodulation and decode means of FIG. 3 above for decoding an input series of message signals having different associated corruption levels.

Referring to FIG. 5 herein there is described overall data processing steps implemented in the receive channel apparatus to decode noise corrupted encoded signals. In step 500, analyzer 301 assesses a corruption level of each incoming packet, and in step 501 determines a pre-determined number of iterations required to decode the incoming packet signal. In step 502, analyzer 301 pre-pends the data describing the number of iterations to a header on the packet. The message packet and header are sent to scheduler 304 in steps 503. The number of iterations data comprises the metrics data pre-pended to the packet which tells the scheduler 304 how much processing power (i.e., a number of turbo decode iterations) is required to be applied to that packet in order to achieve a predetermined bit error rate. In step 504, scheduler 304 selects one of the plurality of processors to decode the packet, according to a locally operated algorithm in the scheduler, and in step 505 the scheduler sends the packet to the selected processor, which decodes the packet by applying the specified number of iterations as determined from (or a variant of the pre-pended iteration data in step 506.

Referring to FIG. 6 herein, there is illustrated schematically components of analyzer means 301 which analyses an input analog signal and generates metrics data corresponding to each multiplexed packet of data. Analyzer means 301 comprises a received signal strength indicator 600 which measures a received signal strength of the down converted input analog signal; a carrier to noise measurement means 601 which determines for each message packet a measurement of carrier signal to noise ratio from the down-converted analog signal and produces digital data describing a measured carrier to noise ratio; and means 602 for determining an optimum number of iterations of turbo code for decoding a message packet signal having received signal strength as measured by the receive signal strength indicator 600, and a carrier to noise ratio as determined by CNR measurement means 601.

In the best mode herein, the means 602 for determining the optimum number of iterations of the turbo code comprises a processor and memory means storing a look-up table of digital data relating a measured carrier to noise ratio with a predetermined number of iterations. An example of a representation of data stored in the look up table is illustrated in Table 1 herein, as follows:

TABLE 1

| CNR | No of iterations |
|---|---|
| CNR > 3 dB | 1 |
| 2.8 dB < CNR < 3 dB | 2 |
| 2.5 dB < CNR < 2.8 dB | 4 |
| <2.5 dB | 5 |

According to the data stored in the analyzer means represented by table 1, for multiplexed packets having a carrier to noise ratio of more than 3 dB to achieve a predetermined bit error rate, a turbo decoder should be set for one decode iteration. For multiplex packets having a carrier to noise ratio of between 2.8 and 3 dB two turbo decode iterations are required, and for packet signals having a carrier to noise ratio of between 2.5 and 2.8 dB four turbo decode iterations are required. For signals having a carrier to noise ratio of less than 2.5 dB, decoding of 5 turbo code decode iterations are required. The analyzer means may store a plurality of look up tables containing data as described above, each of the plurality of look up tables relating to a different value of required bit error rate. The header data includes data identifying an optimum number of iterations of turbo code, generated from the look-up table. Output of demodulator 300 comprises a plurality of packets 302, each having an appended header metrics data 303 describing an optimum number of turbo code iterations for decoding that particular packet. Each packet output from the demodulator has a different level of associated noise and corruption, and is identified by the metrics header data with an instruction for decoding the packet data.

A key characteristic of a turbo decode process, is that the process is iterative. Turbo decoders operate using a plurality of "constituent codes". For example, where two constituent codes are used, the decoder operates by firstly attempting to decode a first constituent code, and then attempting to decode a second constituent code. The decoder may then return for a second attempt at decoding the first constituent code, followed by a second attempt at decoding the second constituent code, followed by a third attempt at decoding the first constituent code and so on, over a number of Rerations, until a required bit error rate has been achieved. Each time the decoding process carries out an iteration the bit error rate of the decoded signal improves. For example, it may be that 10 iterations are required in order to produce a required predetermined bit error rate. During this iterative process, the quality of the decoded signal, measured in terms of bit error rate, converges to a limit which is asymptotically approached. Early iterations provide a marked improvement in the bit error rate of the decoded signal, compared to the demodulated signal which is input into the turbo decoder, whereas successive iterations give a correspondingly smaller incremental improvement in bit error rate and eventually there is reached a limiting bit error rate beyond which it is not possible to improve the quality of the signal, however many iterations are undertaken. Since each iteration of the turbo decoder requires an amount of processing power and utilizes the digital signal processing resources to operate a quantity of instructions, to achieve a common predetermined bit error rate for differing input signals which have different carrier to noise ratio, at any one time a different number of iterations may be being performed on different packets being processed in parallel from one turbo decoder to the next.

Thus, for packets received from different users over different transmission links having different transmission characteristics and therefore different raw bit error rates of received signal, the scheduler routes these packets to selected decoders for decoding, on the basis of the metrics data appended to each packet by the analyzer 301, in order to manage the decoding of the packets and to allocate the total digital signal processing resource provided by the plurality of turbo decoders in an optimised manner.

Referring to FIG. 7 herein, there is illustrated schematically local storage of data packets at a local decoder buffer 319 prior to processing by turbo decoder 312. The total buffering capacity of local decoder buffer 319 must be sufficient that data can be stored in the local buffer whilst turbo decoder 312 operates a pre-determined number of iterations.

Each of turbo decoders 312–318 receives control signals from scheduler 304 for controlling the number of iterations for which any particular packet is to undergo. Such control signals sent from the scheduler to the buffer include data identifying the individual packet and describing the number of iterations for which the turbo decoder must operate for that packet.

Each decoder generates data describing the occupancy of its buffer, and describing the current number of iterations which it is operating, and describing how many iterations it is currently instructed to undertake on a particular packet. This information is fed back to scheduler 304 from each of turbo decoders 312–318. From this information, scheduler 304 can determine which decoder is going to be the next decoder to finish processing. Scheduler means 304 receives sequentially the series of packets, each having its own metrics data header. Scheduler 304 sends each packet of data to one of the plurality of turbo decoders operating in parallel, with the object of decoding all received data packets with an optimum number of iterations in order to produce a predetermined bit error rate at the output of the turbo decoders, and with the minimum amount of data processing power requirement.

Figure 8:
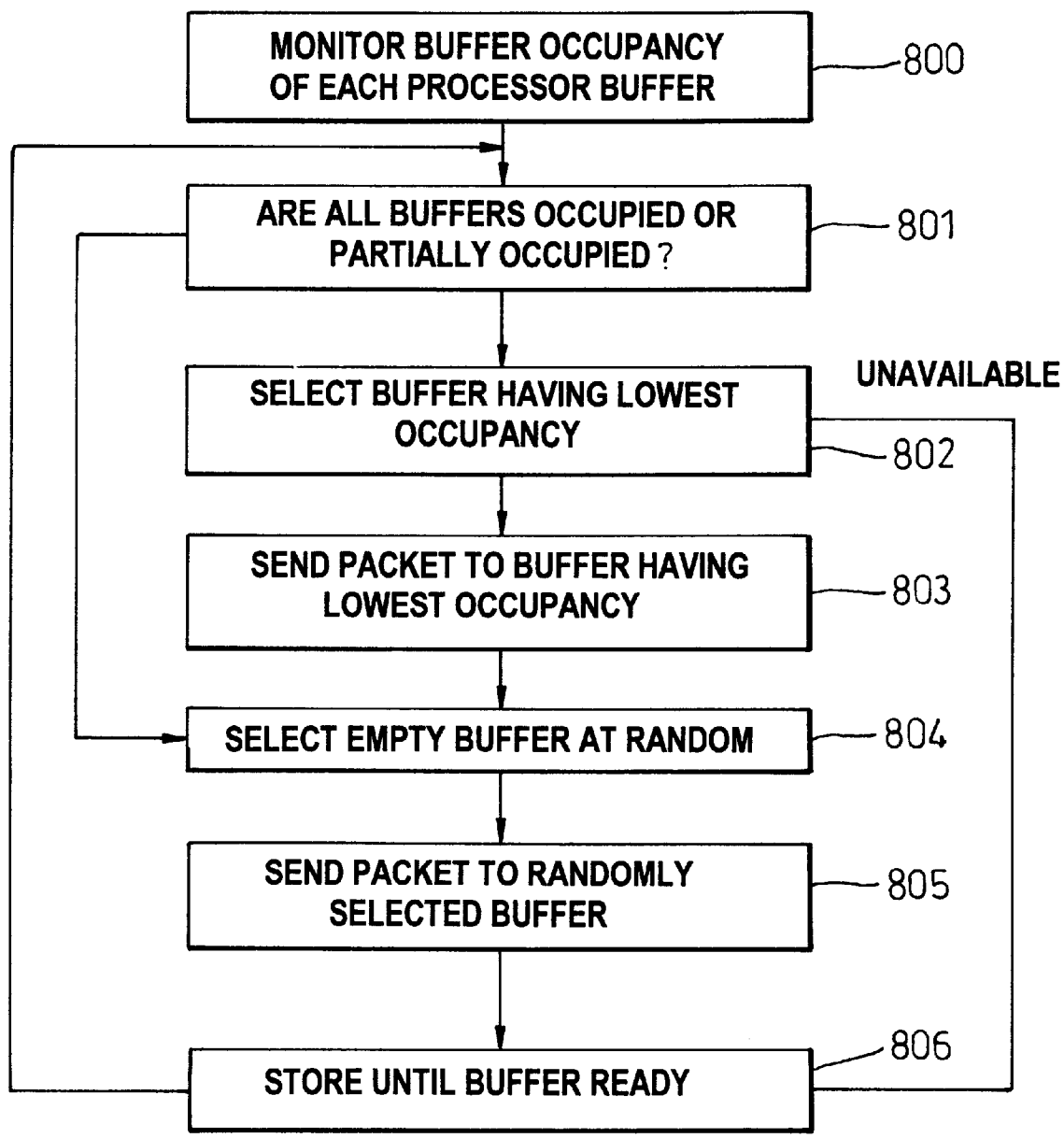
FIG. 8 illustrates schematically general process steps operated by a scheduler comprising the demodulation and decode means of FIG. 3 for allocating message signals to individual ones of an array of a plurality of turbo code decoders according to a specific method of the present invention.

Selection of a turbo decoder for decoding any particular incoming packet is made by scheduler 304, in accordance with an allocation algorithm. In the best mode herein, a simple version of allocation algorithm may be as shown in FIG. 8 herein. Scheduler 304 monitors a buffer occupancy of each of the buffers 319–325 corresponding to turbo decoder processors 312–318 in step 800. In step 801, the algorithm checks whether all buffers are fully or partially occupied. If all buffers are currently occupied with at least some data, the algorithm in step 802 selects the buffer having a lowest data occupancy and in step 803 sends the packet to that buffer for decoding. If, in step 801, there are found to be one or more empty buffers, in step 804 the algorithm selects the single empty buffer if only one buffer is found empty, or if more than one buffer is empty, the scheduler selects an empty buffer at random. In step 805 the scheduler sends the packet to the selected empty buffer. If all buffers are occupied, and a buffer having a lowest occupancy is unavailable in step 806, the scheduler may store the packet data locally in a local buffer at the scheduler until one of the decoder buffers 319–325 becomes available. Buffering of signals at the scheduler is optional, and if no buffering is provided at scheduler 304, incoming data will be overwritten and lost. In the best mode herein, the capacity of buffers 319–325 associated with turbo decoders 312–318 is sufficient that buffering at the scheduler 304 is unnecessary.

Figure 9:
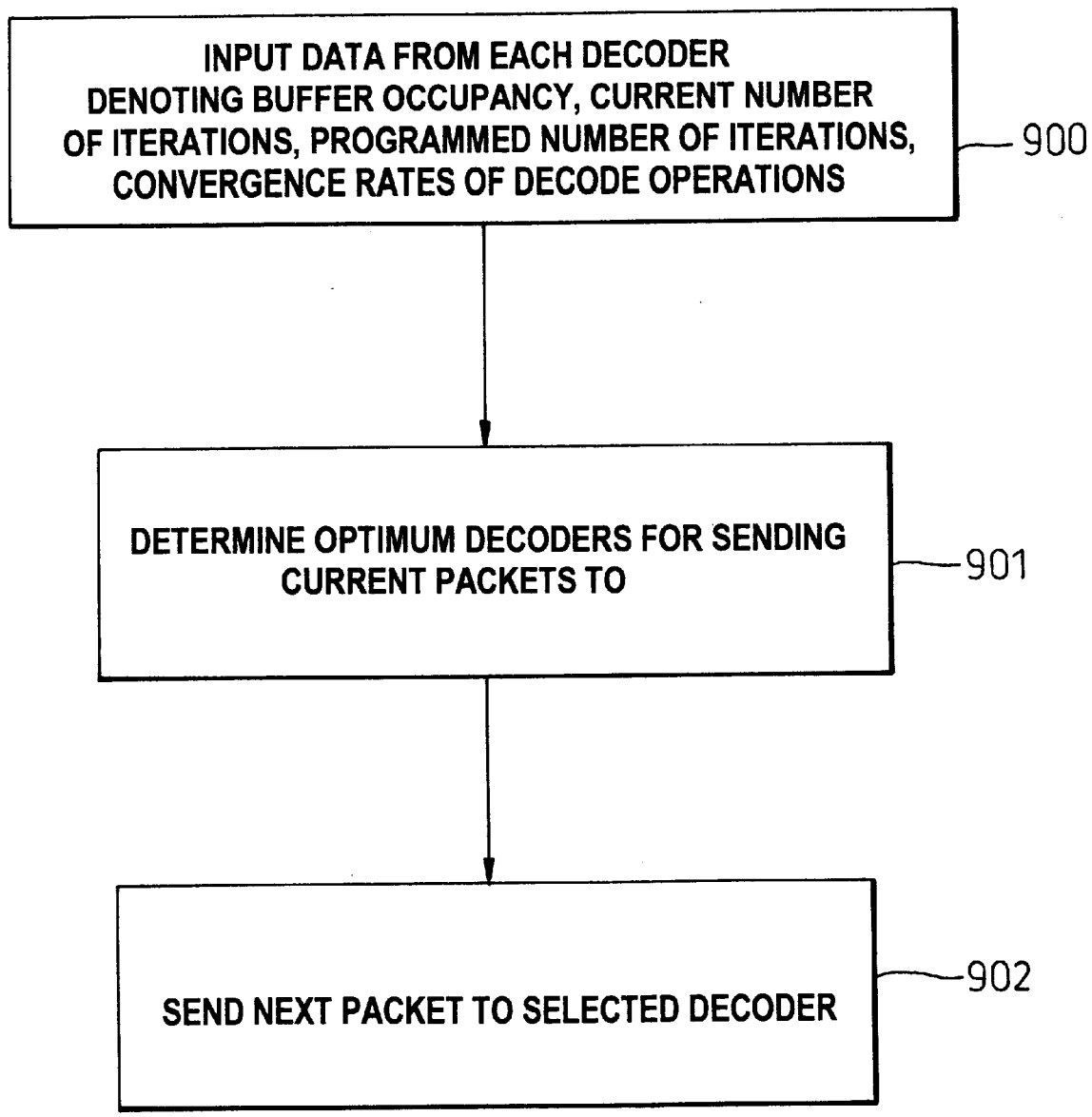
FIG. 9 illustrates schematically an overview of the second mode of operation of the scheduler means, for allocating message signals to the array of a plurality of turbo code decoders.

In another specific method of operation, scheduler 304 may operate an algorithm as described with reference to FIG. 9 herein for selecting a decoder. In step 900, data is received from each decoder of the plurality of decoders in the decoding array, and is maintained as a schedule of data in the scheduler the data describing for each decoder buffer occupancy of the associated decode buffer, a current number of iterations which the decoder has carried out, a programmed number of iterations which the decoder is undergoing to decode a current packet, and data describing a convergence rate of the decode operation for each decoder. The decoding processors pass back information concerning convergence rates of the decoding processes locally operated, to the scheduler 304. The scheduler updates its schedule, to monitoring the likely finish times for each packet being decoded. This allows the scheduler to assign different packets having different iteration requirements as between the plurality of decoders, to optimize the overall utilization of the array of decoders. In step 901, the scheduler determines which decoders to send currently received packets to. The scheduler sends the next packet to the selected decoder, as soon as adequate buffer space is available in the decoder's corresponding buffer in step 902.

Figure 10:
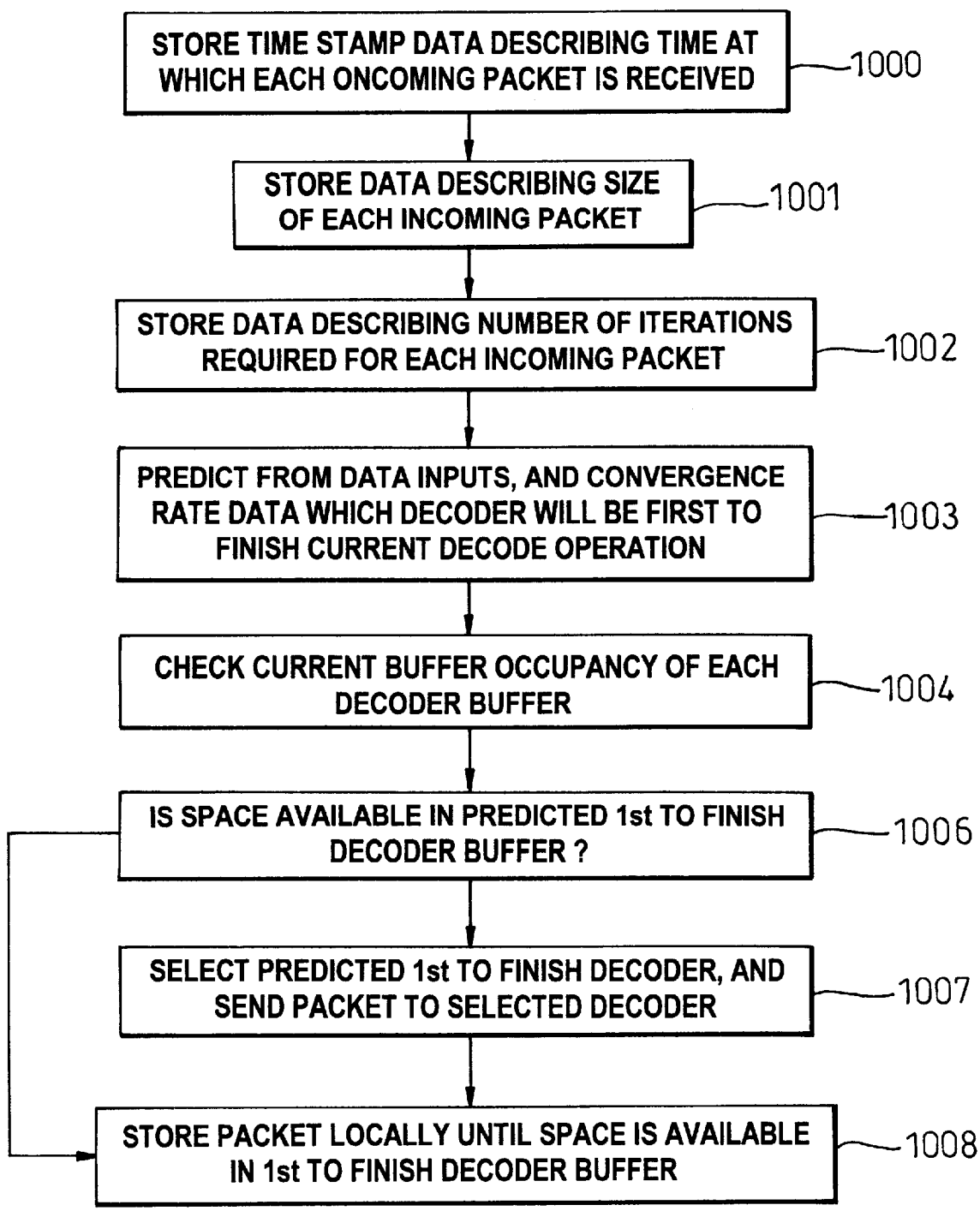
FIG. 10 illustrates process steps carried out by the scheduler for selecting an optimum decoder for sending a particular message packet to, operated by the scheduler means.

Referring to FIG. 10 herein, there is illustrated in more detail step 901 operated by the scheduler of determining the optimum decoders for sending currently received packets to. Operation of the process steps of FIG. 10 may be carried out in practice by operation of a processor under control of an algorithm, for example as programmed in a conventional programming language eg., C, or C++. In step 1000, the scheduler stores time stamp data describing a time at which each incoming packet message is received by the scheduler. Time stamp data relating to each message packet may be used by the scheduler to ensure that packets are not unnecessarily delayed at the scheduler for longer than a predetermined period. In step 1001, the scheduler stores data describing the size of each coming packet, in terms of number of bits received. In step 1002, the scheduler stores the data received from the pre-pended header of the received message packet, describing the number of iterations required to decode that packet. Thus, the scheduler may store data, for each packet, describing the time at which the packet is received, the size of the packet, and the number of decode iterations determined by the analyzer. In step 1003, the scheduler may determine an estimate of the number of instructions to be carried out at a decoder, for decoding a packet, determining this number of instructions from the data describing the size of the packet and the number of iterations required to decode the packet. The scheduler receives convergence data inputs from each of the decoders describing a convergence rate at which the decoder is approaching the limit beyond which it cannot improve the error rate of its current decode operation. In step 1004, from the data inputs received in step 1003 and the convergence rate data received from the decoders, the scheduler operates a prediction algorithm to predict which decoder will be first to finish its current decode operation. In step 1005, the scheduler, having received continuous real time data from each decode buffer describing a current buffer occupancy, checks the buffer occupancy of each decode buffer. In step 1006, the scheduler determines whether sufficient space is available in the decode buffer corresponding to the predicted first to finish decoder, for storing a current packet. If sufficient space is available, the scheduler will send a current packet to the predicted first to finish decoder in step 1007. If sufficient space is not available in the predicted first to finish decoder to decode a current packet, the scheduler may store the packet locally in scheduler buffer 320, until sufficient space is available in the decode buffer of the first to finish decoder, and when such space becomes available, the scheduler sends the packet to the predicted first to finish decoder.

The scheduler buffer 320 may be used to store incoming packets temporarily prior to routing to the decode buffers. The scheduler does not necessarily send the incoming packets to the decoders in the order in which the incoming packets were received by the scheduler. For example, the scheduler may delay a packet having a high decode iteration requirement, waiting for a particular decoder to finish. For example, where a predicted first to finish decoder is decoding a packet with a requirement for a low number of iterations, the scheduler may avoid sending a current packet requiring a low number of iterations to that first decoder, but may schedule a later received packet requiring a larger number of decode iterations for sending it to the first decoder. Meanwhile, the current packet requiring a low number of decode iterations may be sent to another decoder which may become available after the first decoder.

As will be appreciated by the person skilled in the art, optimum allocation of individual message packets to individual decoders depends upon the parameters of packet size, availability of decoder, decode buffer occupancy, and number of decode iterations required by a packet. Conventional artificial intelligence techniques may be applied within the scheduler in real time to assign incoming message packets to individual decoders to achieve the optimum utilization of decoder processing power.

What is claimed is:

1. A decode apparatus for decoding a plurality of encoded messages each said message having an associated corruption level, said decoding means comprising:

analyzer means for determining a level of corruption of each said message and generating data describing a signal processing requirement for decoding each said message;

at least one decoder for decoding said encoded messages; and scheduler means for assigning said messages to individual ones of said at least one decoder depending on said signal processing requirement data generated by said analyzer means.

2. Apparatus as claimed in claim 1, wherein said analyzer means comprises:

means for determining a carrier to noise ratio metric of a said message;

means for assigning a number of turbo code decoding iterations to said message.

3. Apparatus as claimed in claim 2, wherein said means for determining a number of turbo code decoding iterations comprises a data storage means containing data describing carrier to noise ratio and number of iterations, and a relationship between said carrier to noise ratio and said number of iterations.

4. Apparatus as claimed in claim 1, wherein each said decoder sends signals to said scheduler concerning a status of said decoder.

5. Apparatus as claimed in claim 4, wherein a said status signal comprises data describing a current number of iterations performed on a specified message packet.

6. Apparatus as claimed in claim 4, wherein a said status signal comprises data describing a convergence rate of bit error rate of a said message.

7. Apparatus as claimed in claim 1, further comprising a plurality of buffers, for storing said messages at said decoders, wherein said scheduler sends said message packets to selected individual ones of said buffers for storage prior to decoding.

8. A method of decoding a plurality of encoded message packets, each said message packet having an associated corruption level, said method comprising the steps of:

determining a metric describing said corruption level of each said message packet;

determining according to said metric data, a number of decode iterations required for decoding each said message packet; and allocating a signal processing resource for decoding said message packets, depending on said number of required decode operations for each said packet.

9. The method as claimed in claim 8, wherein said step of determining a required number of decode iterations comprises:

storing data describing a plurality of levels of corruption of a plurality of message packets;

storing data describing a plurality of numbers of decode iterations required to achieve a predetermined bit error rate, wherein said data describing a number of decode iterations are stored in a manner which correspond with data describing individual ones of said corruption levels in a predetermined manner.

10. The method as claimed in claim 8, wherein said step of allocating a digital signal processing resource comprises selecting a digital signal processor having a lowest buffer occupancy.

11. The method as claimed in claim 8 wherein said step of allocating a digital signal processing resource comprises selecting a digital signal processor means, having a predicted earliest finish time.

12. The method as claimed in claim 8, wherein said signal processing resources comprise a plurality of turbo code decoders, operating independently of each other.

* * * * *